United States Patent [19]
Khare et al.

[11] Patent Number: 6,048,748
[45] Date of Patent: Apr. 11, 2000

[54] ADVANCED SEMICONDUCTOR DEVICES FABRICATED WITH PASSIVATED HIGH ALUMINUM CONTENT III-V MATERIALS

[75] Inventors: Reena Khare, Sunnyvale; Fred A. Kish, San Jose, both of Calif.

[73] Assignee: Hewlett-Packard Company, Palo Alto, Calif.

[21] Appl. No.: 09/293,277

[22] Filed: Apr. 16, 1999

Related U.S. Application Data

[62] Division of application No. 09/231,411, Jan. 14, 1999.
[51] Int. Cl.[7] .................................................. H01L 21/00
[52] U.S. Cl. .............................. 438/39; 438/46; 438/47
[58] Field of Search ............................ 438/33, 39, 46, 438/47

[56] References Cited

U.S. PATENT DOCUMENTS

| | | | |
|---|---|---|---|
| 5,262,360 | 11/1993 | Holonyak, Jr. et al. | 437/237 |
| 5,400,354 | 3/1995 | Lupowise et al. | 438/47 |
| 5,403,775 | 4/1995 | Holonyak, Jr. et al. | 438/38 |
| 5,517,039 | 5/1996 | Holonyak, Jr. et al. | 257/94 |
| 5,550,081 | 8/1996 | Holonyak, Jr. et al. | 437/129 |
| 5,567,980 | 10/1996 | Holonyak, Jr. et al. | 257/631 |
| 5,696,023 | 12/1997 | Holonyak, Jr. et al. | 437/133 |
| 5,798,537 | 8/1998 | Nitta | 257/103 |
| 5,872,020 | 2/1999 | Fujii | 438/31 |
| 5,888,370 | 3/1999 | Sun et al. | 257/94 |

*Primary Examiner*—Kevin M. Picardat

[57] ABSTRACT

For AlGaAs LEDs the confining layers adjoining the active layer possess the highest Al composition. From failure analysis of non-passivated, WHTOL-aged, AlGaAs LEDs, it was discovered that corrosion occurs the fastest at the exposed surfaces of the high Al-content confining layers. By placing a high-quality native oxide at the exposed surfaces of the high Al-content confining layers which protect from the formation of the 'poor' oxide, it is possible for LEDs to retain essentially their same light output after 2,000 hours of WHTOL testing. Further, it is possible to improve carrier confinement, carrier injection, wave guiding, and other properties by increasing the Al-content of different layers.

5 Claims, 9 Drawing Sheets

WHTOL Performance of Die vs. Wafer-Level Passivated TS-AlGaAs LEDs

ADVANCED SEMICONDUCTOR DEVICES FABRICATED WITH PASSIVATED HIGH ALUMINUM CONTENT III-V MATERIALS

CROSS REFERENCE TO RELATED APPLICATION(S)

This is a divisional of copending application Ser. No. 09/231,411 filed on Jan. 14, 1999.

TECHNICAL FIELD

The present invention relates generally to the field of III–V semiconductor devices and more particularly to the fabrication of devices with aluminum (Al)-containing III–V semiconductor materials.

BACKGROUND ART

The general background of the present invention is disclosed in U.S. Pat. No. 5,262,360 by Holonyak, Jr. and Dallesasse (Holonyak '360) entitled "AlGaAs Native Oxide" granted Nov. 16, 1993 and U.S. Pat. No. 5,517,039 by Holonyak, Jr. et al (Holonyak '039) entitled "Semiconductor Devices Fabricated with Passivated High Aluminum Content III–V Materials" granted May 14, 1996. Holonyak '039 is co-assigned with the present invention to the Hewlett-Packard Company.

High aluminum (Al) containing III–V semiconductor materials degrade in wet; high-temperature environments due to the formation of an undesirable Al-oxide, primarily thought to be $Al[OH]_3$. These oxides tend to be optically absorbing and limit the transmission of light from light emitting semiconductor devices. The poor Al-oxide can also attack the crystal structure of the device.

One method of preventing device degradation is to grow a high quality native oxide that effectively seals the device and prevents the formation of a poor, optically absorbing Al-oxide. Native oxides are formed at higher temperatures and include $Al(O)OH$ and $Al_2O_3$. A device is considered passivated if the native oxide prevents or significantly reduces the formation of the poor oxide (e.g., $Al[OH]_3$) when the device is operated in wet, high-temperature environments. Within this description, there can be different degrees of passivation for devices that have been subjected to wet, high-temperature operating life (WHTOL) testing based on the amount of device degradation after operating for a fixed time.

For example, a light emitting diode (LED) may be considered fully-passivated if the emitted light output power (LOP) has degraded less than 20% after 2000 hours of WHTOL operation.

An LED is considered partially-passivated if the LOP has degraded less than 50% after 2000 hours of WHTOL operation. Thus, the term "passivated" describes devices from partially to fully passivated. Herein, the conditions of a WHTOL test are under 20 mA loading (i.e., forward bias in an LED) in an atmosphere of 85% relative humidity and a temperature of 85° C.

A method for forming high quality native oxides through the use of a water vapor environment at elevated temperatures is described in Holonyak '360 and is applicable herein. A wide range of temperatures is described between 375° C. to 1000° C. to grow native oxides in Al-bearing materials. In Holonyak '039 it was specified that the most critical areas of a semiconductor device to passivate were those in which the majority of the light generated by the light emitting diode (LED) are transmitted. This is based on the belief that corrosion was accelerated by photon interactions. Holonyak '039 also specifies the need to control the temperature and time of the oxide growth period so the thickness of the native oxide growth is within a particular thickness range. Specifically, the native oxide film must be thicker than 0.1 um to avoid pinholes or cracks in the film, but thinner than 7.0 um which can cause cracks in the film due to internal stress. The cracks can prevent complete passivation and result in light output loss during WHTOL tests. In Holonyak '039 it also stated that that the water vapor oxidation temperature range should be 375° C. to 550° C., preferably from 450° C. to 550° C., and the most preferable oxidation time is 0.25 hour to 2 hours.

In light emitting devices it is often desirable to incorporate wide band gap, high Al content layers for improved carrier confinement, carrier injection, wave guiding-properties, etc. For example, it is known that the emission efficiencies of red-emitting aluminum gallium arsenide (AlGaAs) LEDs can be improved by increasing the Al-mole fraction, x, of the high-composition $Al_xGa_{(1-x)}As$ confining layers immediately adjoining the active layer. However, the destructive oxide degradation problems have limited the content of these $Al_xGa_{(1-x)}As$ layers to the range where the Al mole-fraction, x, is less than 0.75. The mole fraction, x, indicates the amount of Al in the layer and is defined as the fractional composition of Al to the Group III element in the layer.

The prior art has shown the performance of Al-bearing semiconductor devices can be greatly improved through the use of native oxide passivation. Although many issues have been addressed, there is still no viable method for using this technique in high volume manufacturing. To successfully implement this technology, it is critical to have processing techniques that can be used to passivate the device areas that have the greatest impact on the device performance and reliability.

DISCLOSURE OF THE INVENTION

It has been discovered that the most critical areas for passivation are the highest aluminum (Al)-content exposed layers of the device. For Al-bearing substrate AlGaAs LEDs, the confining layers adjoining the active layer possess the highest Al content. Failure analysis of non-passivated WHTOL-aged Al-bearing substrate AlGaAs LEDs indicates that corrosion occurs the fastest at the exposed surfaces of the high-Al content confining layers. By placing a high-quality native oxide at the exposed surfaces of the high-composition Al-content confining layers which protect from the formation of the 'poor' oxide, it is possible for LEDs to retain essentially their same light output after 2,000 hours of WHTOL testing.

Although passivating the highest exposed Al-content layers improves the WHTOL degradation, partial passivation results in only partial WHTOL protection. It is desirable and optimal to passivate all or the majority of the exposed Al-bearing layers in the light-emitting device structure. Such full passivation results in the optimal WHTOL performance for Al-bearing substrate AlGaAs LEDs. However, a consequence of full-wafer processing is that it is very difficult (or nearly impossible) to completely expose all edges of the devices (by singulating them) prior to oxidation. The present invention provides a method of exposing the majority of the edges, especially those with the highest Al-bearing layers, leaving the remaining layers intact and connected. This structure can be realized by etching mesas (using wet chemical and/or dry plasma processes), sawing partially through the wafer, or a combination of both. Such processing facilitates the exposure of the layers most prone to degradation for oxidation-passivation while allowing full-wafer processing. The oxidation can occur prior to or after the deposition of the top and/or bottom metallization layers or contacts. Areas that are left connected should be of the lowest Al-content (or be Al-free). If the connected layers do contain Al, the surface areas of these layers should be kept to a minimum compared to the remainder of the device area. In addition, it is preferable that the non-oxidized exposed surfaces of the connected layers pass a minimum amount of light after singulation under device operation to minimize any photon-assisted degradation.

In an Al-free substrate AlGaAs LED, a thick GaAs substrate can be employed as a connected carrier layer, allowing all of the Al-bearing layers to be exposed to oxidation-passivation. Again, depending on the oxidation conditions, the lower Al-content active layer may or may not be passivated.

For Al-free and Al-bearing substrate AlGaAs LEDs, it is necessary to oxidize the LEDs from 500 to 625° C. for 1 to 60 minutes to ensure passivation. It has been determined that 600° C. for 5 minutes gives the best results for standard Al-bearing substrate AlGaAs LEDs and 550° C. for 6 minutes is optimal for Al-free substrate AlGaAs devices. Different Al contents need different temperatures to create a robust enough oxide for moisture resistance. The thickness of the oxide can also play a part. If an oxide is too thin, it can have pinholes, but if it is too thick, in can stress the device and not let as much light out. Also, the metal contacts can degrade when exposed to high temperatures for a long time, causing turn-on voltage issues.

The ability to successfully passivate high Al-content composition layers from WHTOL degradation allows the present invention to incorporate wide band gap, high Al-content composition layers for improved carrier confinement, carrier injection, wave guiding properties, etc. The emission efficiencies of the AlGaAs LEDs can be improved by increasing the Al-mole fraction of the high-composition confining layers immediately adjoining the active layer. Native oxidation passivation allows the increase in the Al mole fraction beyond traditional values.

Further features and advantages of the present invention will become apparent to those skilled in the art from a reading of the following detailed description when taken in conjunction with the accompanying drawings.

BEST MODE FOR CARRYING OUT THE INVENTION

Figure 1:
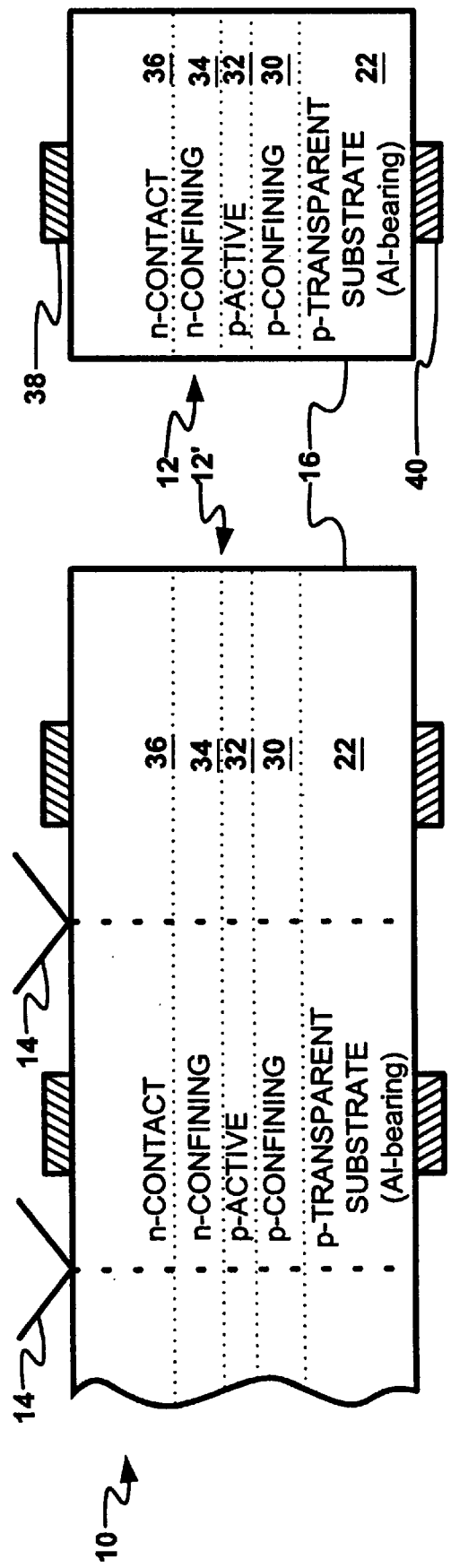
FIG. 1 is a schematic cross-section of an Al-bearing substrate AlGaAs wafer and one device after wafer singulation.

Referring now to FIG. 1 (PRIOR ART), therein is shown a semiconductor wafer 10 which includes two semiconductor devices such as LEDs 12 and 12'. The LEDs 12 and 12' are separated into individual LEDs by a prior art singulation technique of being scribed on the surface at the location indicated by the arrow 14 and broken, leaving the faces 16 as part of the LEDs 12 and 12'. The LED 12 has a carrier layer that is a p-type Al-bearing substrate 22, which may be a transparent substrate. Above the Al-bearing substrate 22 is a p-doped confining layer 30, p-doped active layer 32, and an n-doped confining layer 34. These layers form the double heterostructure, light-emitting device. The confining layer 34 is topped by an n-doped contact layer 36. Above the n-doped contact layer 36 is a metallization layer 38 and, below the Al-bearing substrate 22, is another metallization layer 40.

The LEDs 12 and 12' may be Al-bearing substrate AlGaAs devices with the following structure from top to bottom.

| | $Al_xGa_{1-x}As$ | possible range, x | thickness, t | possible range, t |
|---|---|---|---|---|
| n-contact layer 36 | x = 0.6 | 0–0.40 | 15 μm | 0.01 μm–50 μm |
| n-confining layer 34 | x = 0.75 | 0.5–0.75 | 9 μm | 0.1 μm–50 μm |
| p-active layer 32 | x = 0.39 | 0–0.40 | 2 μm | 0.05 μm–5 μm |
| p-confining layer 30 | x = 0.75 | 0.5–0.75 | 3.5 μm | 0.1 μm–50 μm |
| p-Al-bearing substrate 22 | x = 0.75–0.60 | 0.5–0.75 | 56 μm | 50 μm–500 μm |

The Al mole-fractions and epitaxial layer thickness used in the present invention are specified. Typical ranges of the aluminum mole faction for the different layers are also specified (mole fractions can have either a fixed value or can be graded). It should be understood that the mole fractions could be different in each of the layers.

The mole fraction of the active layer 32 determines the wavelength of the emitted light, with x=0.40 emitting red light and x=0 emitting infrared light. Typical die sizes can vary from a 5 mil×5 mil die footprint to a 100 mil×100 mil die footprint. Typical AlGaAs die sizes are 10 mil to 12 mil.

Figure 2:
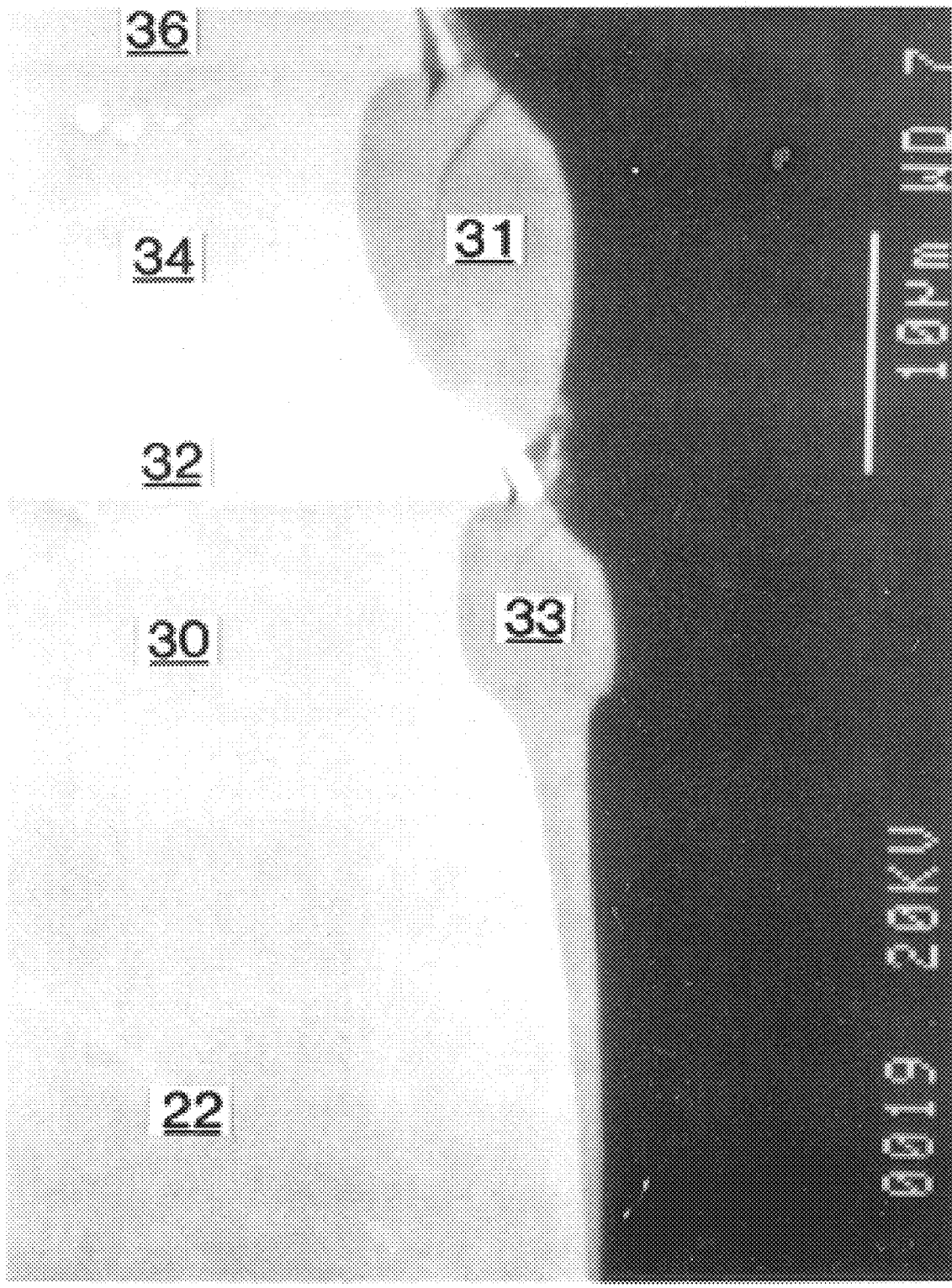
FIG. 2 is a Scanning Electron Micrograph (SEM) cross-section of a Al-bearing substrate AlGaAs LED that has undergone 2000 hours of WHTOL stressing, displaying a poor, optically absorbing oxide on the exposed, high Al-containing layers.

Referring to FIG. 2, therein is shown a Scanning Electron Micrograph (SEM) cross-section of an Al-bearing substrate AlGaAs LED that has been subjected to 2000 hours of WHTOL stressing. The poor oxide 31 and 33 appear on the layers above and below the active layer 32. An analysis of this oxide-induced failure mode led to the discovery that it possesses a chemical dependency on the concentration of Al in the AlGaAs layers 22, 30, 32, and 34. It was further discovered that the corrosion occurs the fastest on the exposed surfaces of the high Al confining layers 30 and 34 that have the highest Al mole-fraction. This result was unexpected in view of Holonyak '039 since the photon flux through the confining layers 30 and 34 is not significantly more than through the other layers.

Figure 3:
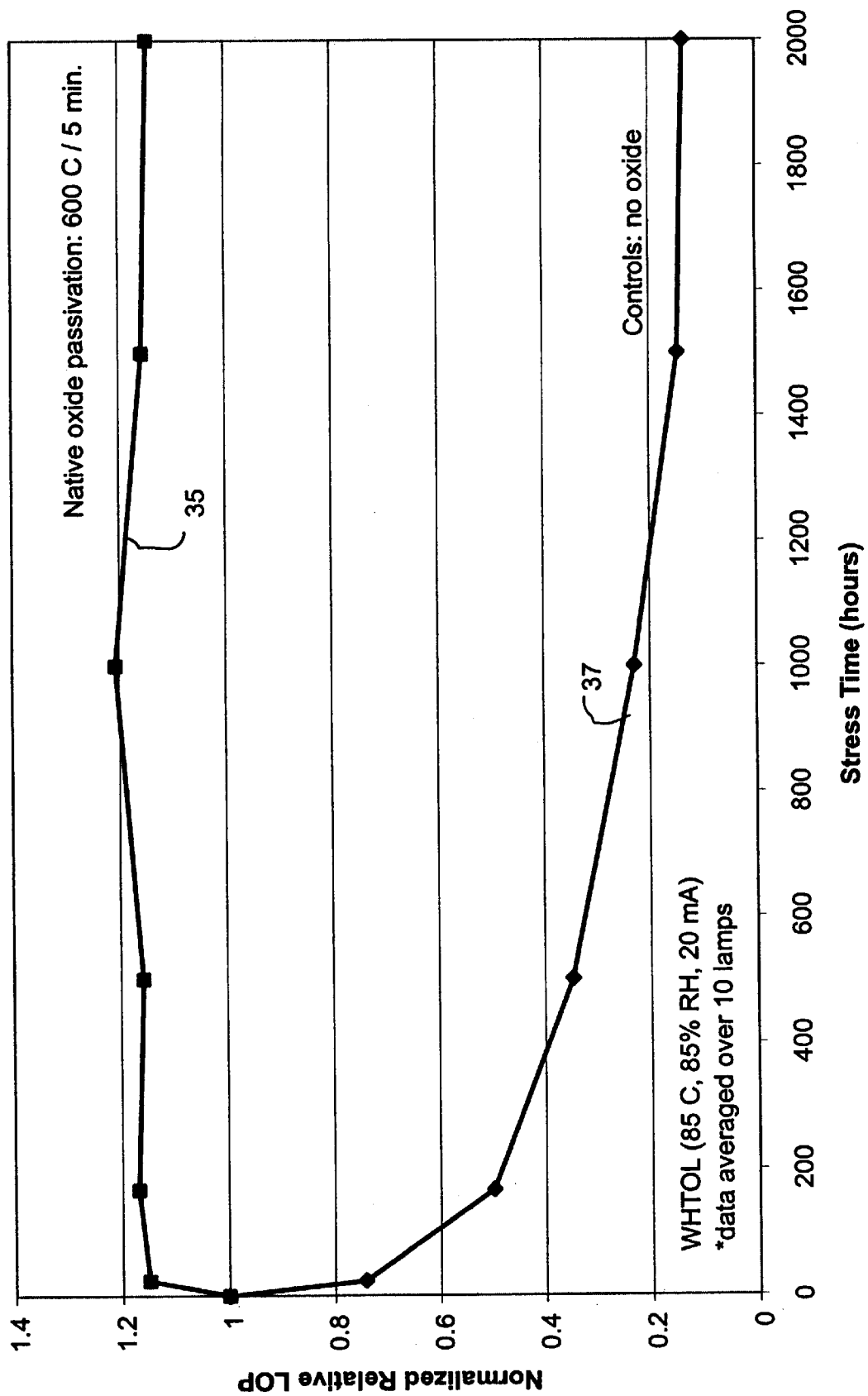
FIG. 3 is a WHTOL LOP degradation curve as a function of stress time for non-passivated and passivated (600° C. for 5 min.) Al-bearing substrate AlGaAs LEDs.

Referring now to FIG. 3, therein is shown one of a plurality of WHTOL LOP (Light Output Power) degradation curves as a function of stress time. Passivated (curve 35) and non-passivated (curve 37) Al-bearing substrate AlGaAs LEDs were used to assess the passivation process as applied to the Al-bearing substrate AlGaAs die of FIG. 1 (PRIOR ART). A wide variety of oxidation times and temperatures were examined and it was discovered that 600° C. for 5 min. shown by curve 35 in FIG. 3 gave the best passivation in terms of WHTOL device performance. The LOP of the non-passivated control LED was degraded by 85% after 2000 hours of WHTOL stressing. The oxidized sample was a fully-passivated sample, showing essentially no degradation after an initial LOP spike at 24 hours which may be due to interface states, dopant redistribution or other factors.

Figure 4:
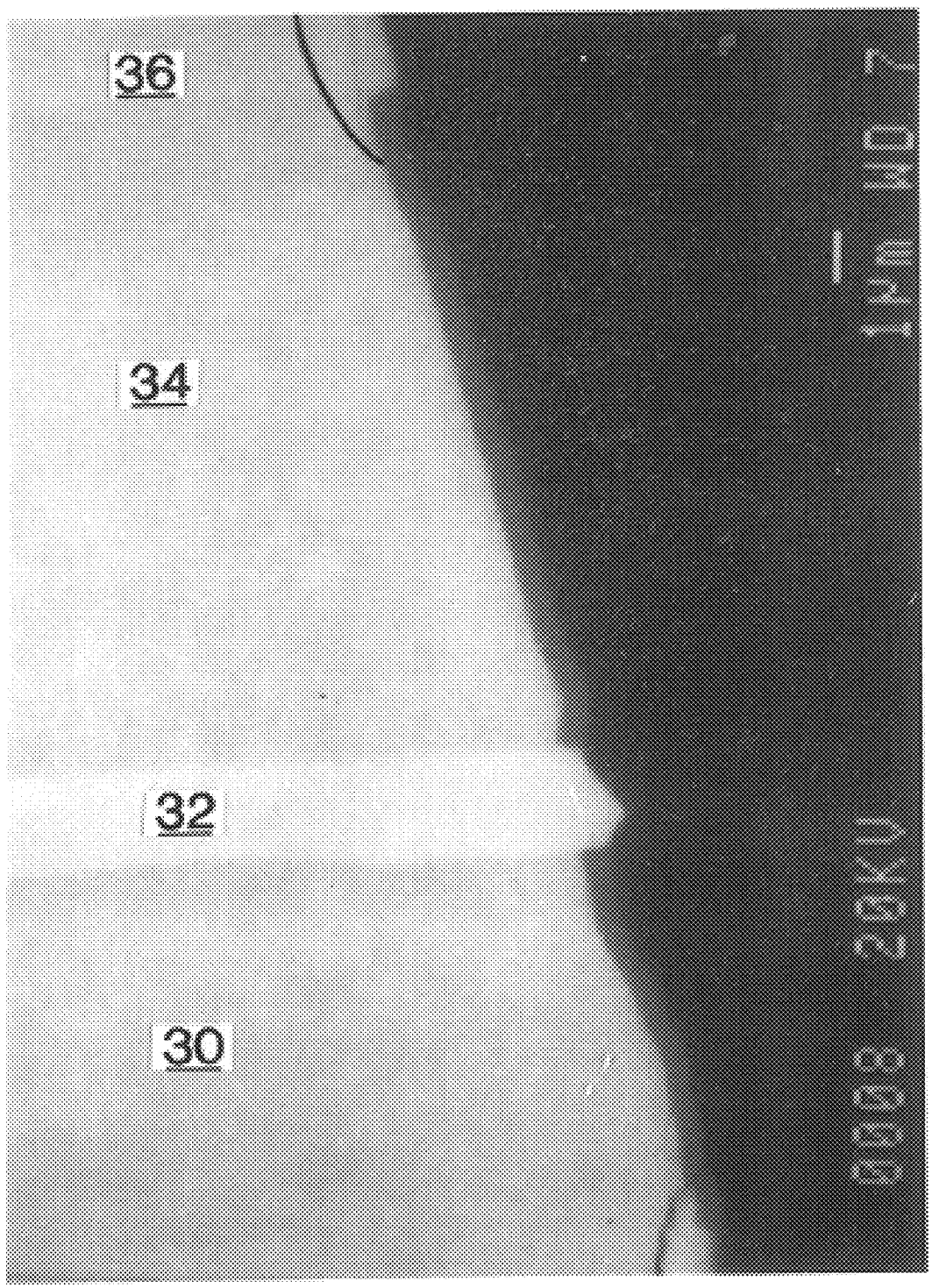
FIG. 4 is a SEM cross-section of a passivated LED (600° C. at 5 min.) that has undergone 2000 hours of WHTOL stress, displaying a protective native oxide growth on the high-Al confining layers.

Referring now to FIG. 4, a SEM cross-section of a passivated LED shows a thin (~1 um), high-quality oxide layer 39 is present that was able to prevent the poor oxide growth shown in the non-passivated LED of FIG. 2.

Figure 5:
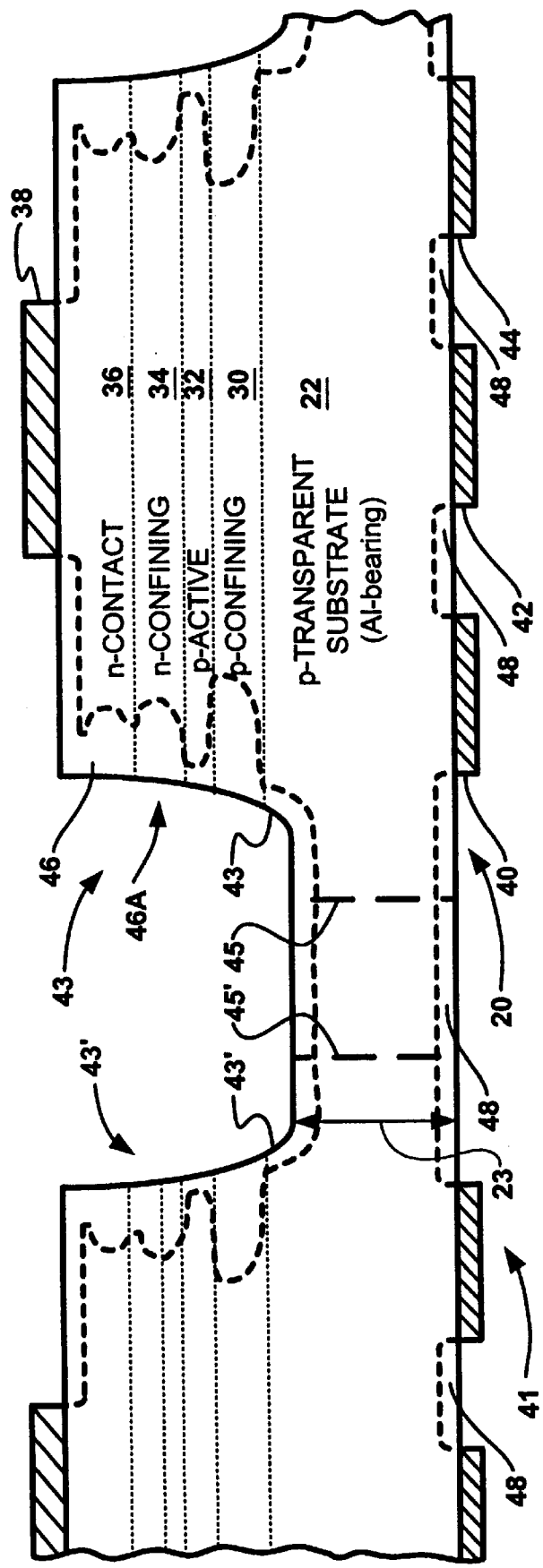
FIG. 5 is a schematic cross-section of portion of a semiconductor wafer containing Al-bearing substrate AlGaAs device structures with a mesa partially separating the devices.

Referring now to FIG. 5, therein is shown a semiconductor wafer 41, which includes two semiconductor devices such as LEDs 43 and 43'. The same layers as in FIG. 1 (PRIOR ART) are given the same numbers. The LEDs 41 and 41' are etched into mesas 43 and 43', passivated by the native oxide water vapor oxidation, and split, or singulated into individual LEDs by sawing or scribing and breaking. The singulating would leave the faces 45 and 45', respectively, as part of LEDs 43 and 43'. Also shown in FIG. 5 are the areas of native oxide passivation 46, 48, and 46A where the oxide thickness can range from 0.1 to 7.0 um.

While the best approach to passivation would involve growing a native oxide on all the exposed Al-containing surfaces, this may not be possible for manufacturing reasons since this would require additional handling of the individual devices after singulation. For practical purposes, it may not be possible to passivate all Al-bearing surfaces of the die. Generally, for manufacturing and cost, it is preferable to perform the wafer-fabrication processes (e.g., the high-temperature water-vapor oxide passivation of the Al bearing layers) in full-wafer form to minimize handling, cost, and throughput issues associated with individual devices. This is especially important in the manufacture LEDs where the volumes are typically in the millions to hundreds of millions of devices fabricated per month. However, a consequences of full-wafer processing is that it is very difficult (or nearly impossible) to completely expose all surfaces of the devices (by singulating them) prior to oxidation.

The structure of FIG. 5 provides a solution which is to expose the majority of the surfaces, especially those with the highest Al-bearing layers, leaving the remaining layers intact and connected. In the practice of the present invention, LEDs 43 and 43' are made from the same Al-bearing substrate AlGaAs LED material described above with the same layer structure. Although the substrate 22 is Al-bearing, mesa etching is used to expose the highest-Al containing layers most prone to degradation, specifically the two confining layers 30 and 34 with Al-mole fraction of 0.75. The wafer is still interconnected via the connected portion 23 of the Al-bearing substrate layer 22. The wafer is oxidized at 600° C. for 5 min. after which the wafer is singulated into individual die via a scribe and break technique. The mesa-etched devices that were oxidized in wafer-form result in partial passivation. The mesa etching exposes the top Al-bearing layers 30, 32, 34, and 36 of FIG. 5 for native oxide passivation. The faces 45 and 45' are exposed only after the oxidation step, and do not have a protective native oxide.

Figure 6:
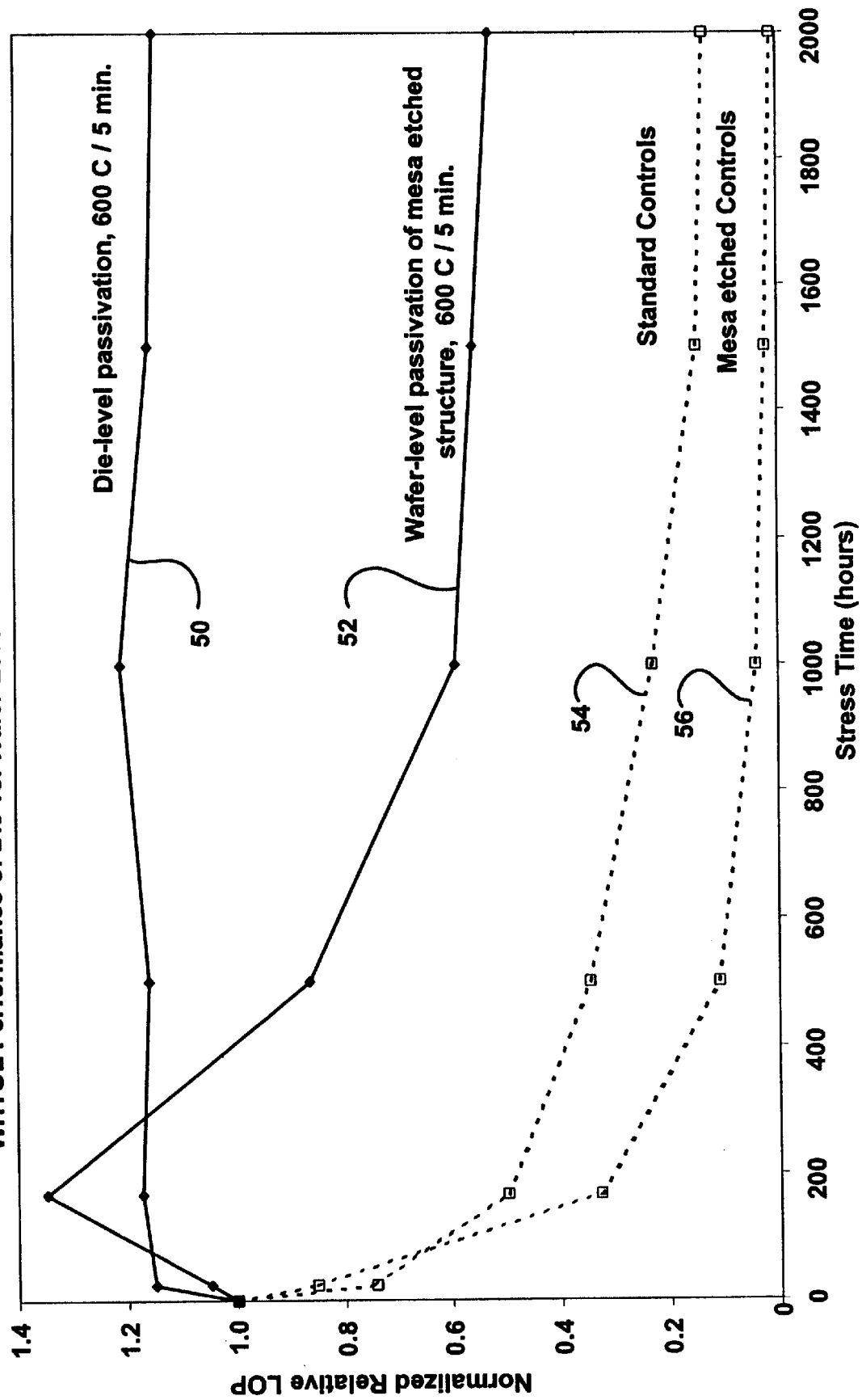
FIG. 6 is a WHTOL LOP degradation curves comparing die-level oxidized and wafer-level oxidized Al-bearing substrate AlGaAs LEDs.

Referring now to FIG. 6, therein is shown a comparison of the WHTOL LOP degradation curves for the die-level passivated device (curve 50), a mesa-etched passivated device (curve 52) of FIG. 5, and non-passivated control samples (curves 54 and 56). The die, which is oxidized in die-form, results in full-passivation. The control samples display a severe 85% LOP degradation after 2000 hours. The wafer level oxidized die display partial passivation with 40% LOP degradation. SEM cross-sections confirm the top half of the die shows no corrosion, while the bottom half displays a poor, optically-absorbing oxide on the Al-bearing substrate layer 22 after 2000 hours of stress.

As design considerations, it should be noted that oxidation can be performed prior to or after deposition of the metallization layers 38, 40, 42, and 44. Ideally, the Al-bearing substrate 22 should be of the lowest Al-content composition for good passivation, although this may compromise the LOP. For practical purposes to facilitate handling in the manufacture of III–V compound semiconductor devices, the connected portion 23 of the Al-bearing substrate 22 should preferably be from 2 to 6 mils in thickness after forming mesas. For an Al-bearing substrate, the thickness should be minimized to minimize exposed Al. In addition it is preferable that the exposed surfaces of the connected layers after singulation pass a minimum amount of light under device operation to minimize any photon-assisted degradation which may occur as described in Holonyak '039. Also, depending upon the oxidation conditions, the lower Al-containing active layer may or may not be oxide passivated. For example, lower oxidation temperatures than those required to passivate the active layer may be required to minimize any dopant diffusion or to preserve the integrity (electrical and/or mechanical) of any previously applied metallizations. Another technique is to oxidize the device first, mask and etch the oxide, then put down the metal contacts. It may also be preferable to design die LED 12 so that the non-passivated area is p-type rather than n-type since n-type layers have been observed to degrade faster than p-type layers. Although not ideal, a wafer level oxidized device will exhibit significantly improved performance compared to a device with no oxidation.

Figure 7:
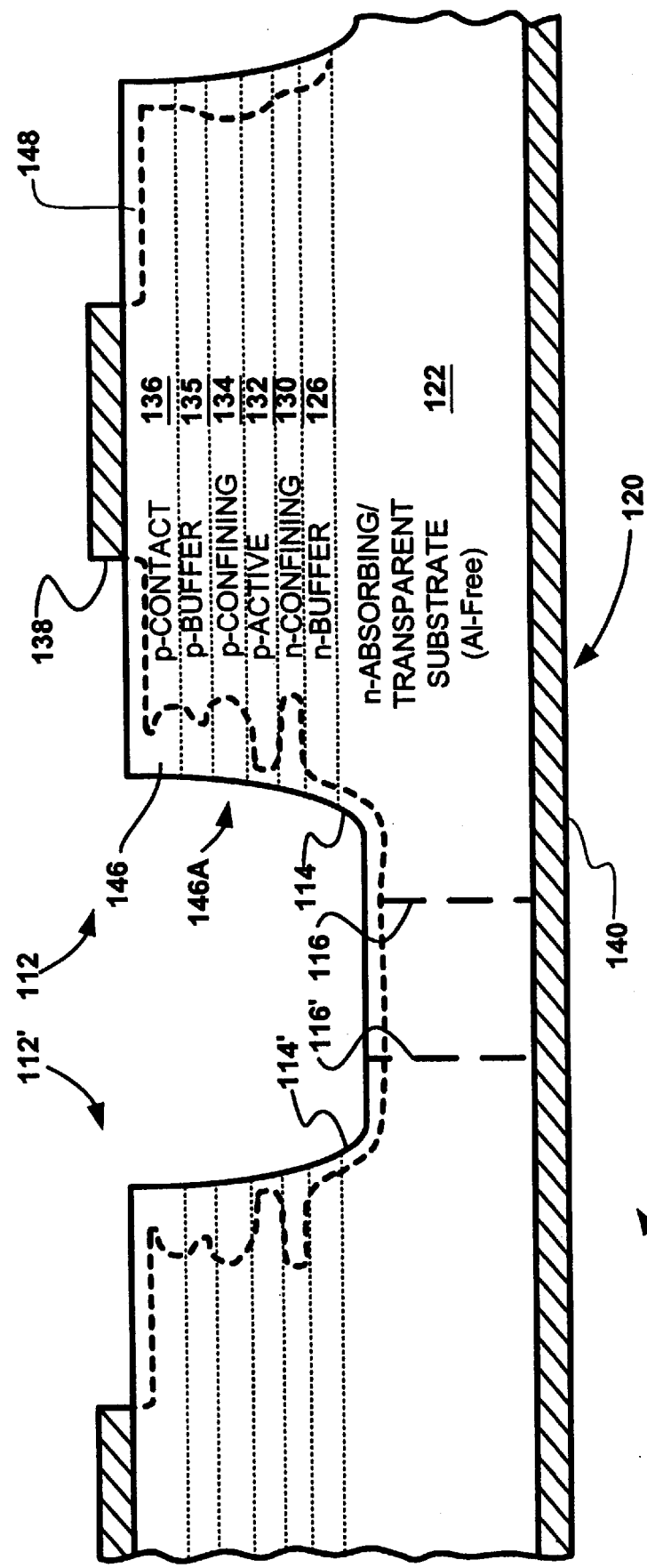
FIG. 7 is a schematic cross-section of a semiconductor wafer containing Al-free substrate AlGaAs device structures with a mesa partially separating the devices.

Referring now to FIG. 7, therein is shown a semiconductor wafer 110 which includes two semiconductor devices such as LEDs 112 and 112'. The LEDs are formed into mesas 114 and 114' that will eventually be split, or singulated, into individual LEDs by sawing or scribing and breaking. The singulation would leave the faces 116 and 116' respectively, as part of the LEDs 112 and 112'. The LED has a carrier layer that is an n-type Al-free substrate 122 which can be either absorbing or transparent substrate. Above the Al-free substrate 122 is an n-doped buffer layer 126. Above the buffer layer 126 is an n-doped confining layer 130, a p-doped active layer 132, and a p-doped confining layer 134. The last three layers form the double heterostructure, light-emitting device. Above the confining layer 134 is the p-doped buffer layer 135 and then a p-doped contact layer 136. Above the p-doped contact layer 136 is a metallization layer 138 and, below the Al-free substrate 122 is metallization layer 140.

The LED 112 may be an Al-free substrate AlGaAs device with the following structure from top to bottom:

| | $Al_xGa_{1-x}As$ | possible range, x | thickness, t | possible range, t |
|---|---|---|---|---|
| p-contact layer 136 | x = 0.27 | 0–0.40 | 1 μm | 0.01 μm–5 μm |
| p-buffer layer 135 | x = 0.50 | 0.5–0.75 | 16 μm | 0.1 μm–50 μm |
| p-confining layer 134 | x = 0.75 | 0.5–0.75 | 10 μm | 0.1 μm–50 μm |
| p-active | x = 0.39 | 0–0.40 | 1.5 μm | 0.05 μm–5 μm |

-continued

| | $Al_xGa_{1-x}As$ | possible range, x | thickness, t | possible range, t |
|---|---|---|---|---|
| layer 132 n-confining | | | | |
| layer 130 n-buffer | x = 0.75 | 0.5–0.75 | 6 µm | 0.1 µm–50 µm |
| layer 126 n-Al-free | x = 0.60 | 0.5–0.75 | 5 µm | 0.1 µm–50 µm |
| substrate 122 | x = 0 | 0 | 250 µm | 50 µm–500 µm |

The Al mole-fractions and epitaxial layer thickness used in the present invention are specified. Typical ranges of the aluminum mole faction for the different layers are also specified (mole fractions can have either a fixed value or can be graded). It should be understood that the mole fractions could be different in each of the layers.

For the AS AlGaAs LED 112, all Al-containing layer are passivated prior to singulation since the Al-free GaAs substrate 122, can be employed as the connected carrier layer. This allows all of the Al-containing layers to be exposed to oxide passivation. It should be noted that a lower composition Al-containing layer (0<x<0.3) may be employed at the contact surfaces to assist in the formation of low resistance contacts. Again, depending on the oxidation conditions, the lower Al-containing active or contact layer may or may not be oxidized. Also, the need to oxidize these surfaces is less important since the lower composition Al-containing compound degrade at significantly lower rates. Typical die sizes can vary from a 5 mil×5 mil die footprint to a 100 mil×100 mil die footprint.

Holonyak '039 indicates that the water vapor oxidation temperature range should be 375° C. to 550° C., preferably from 450° C. to 550° C., and the most preferable time period is 15 minutes to 2 hours. However, for Al-free and Al-bearing substrate AlGaAs LEDs it has been discovered that it is necessary to oxidize the samples from 500° C. to 650° C. for one minute to sixty minutes but generally less than 10 min. to ensure that the samples are well passivated and device performance is not degraded.

Figure 8:
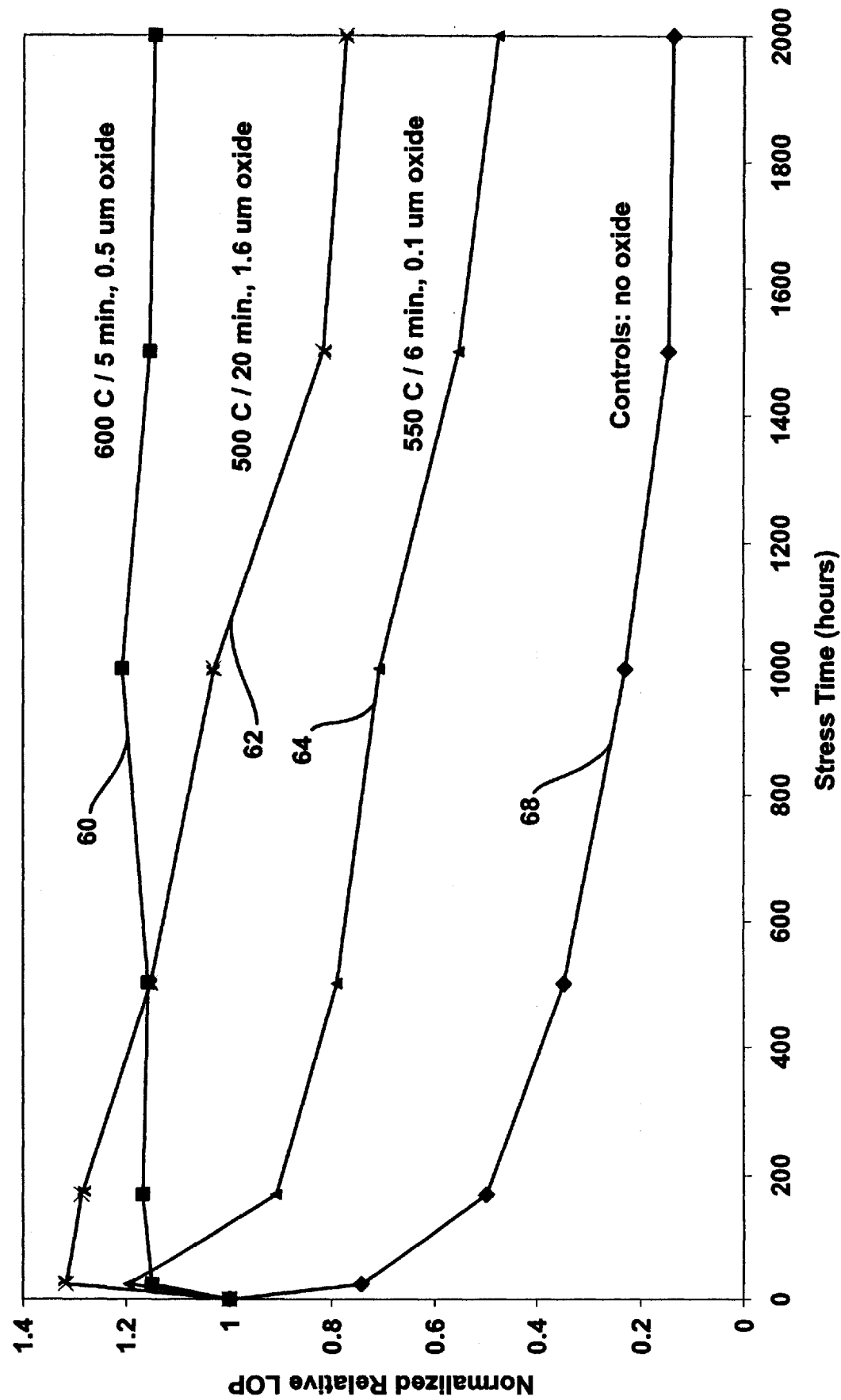
FIG. 8 WHTOL LOP degradation curves for Al-bearing substrate AlGaAs LEDs passivated at different time/temperature conditions.

Referring now to FIG. 8, therein is shown the WHTOL LOP degradation curves for Al-bearing substrate AlGaAs LEDs passivated at different time and temperature conditions (curves 60, 62, 64, and 66). Optimal passivation seems to occur at approximately 600° C. for 5 minutes (as shown by curve 60). The thickness of the oxide alone (typically between 0.1 um and 7.0 um) will not guarantee good passivation. This is especially evident in FIG. 8 because the thicker 1.6 µm oxide deposited at 500° C. for 20 minutes (curve 62) does not passivate as well as the thinner oxide deposited at 600° C. for 5 minutes (curve 60).

Figure 9:
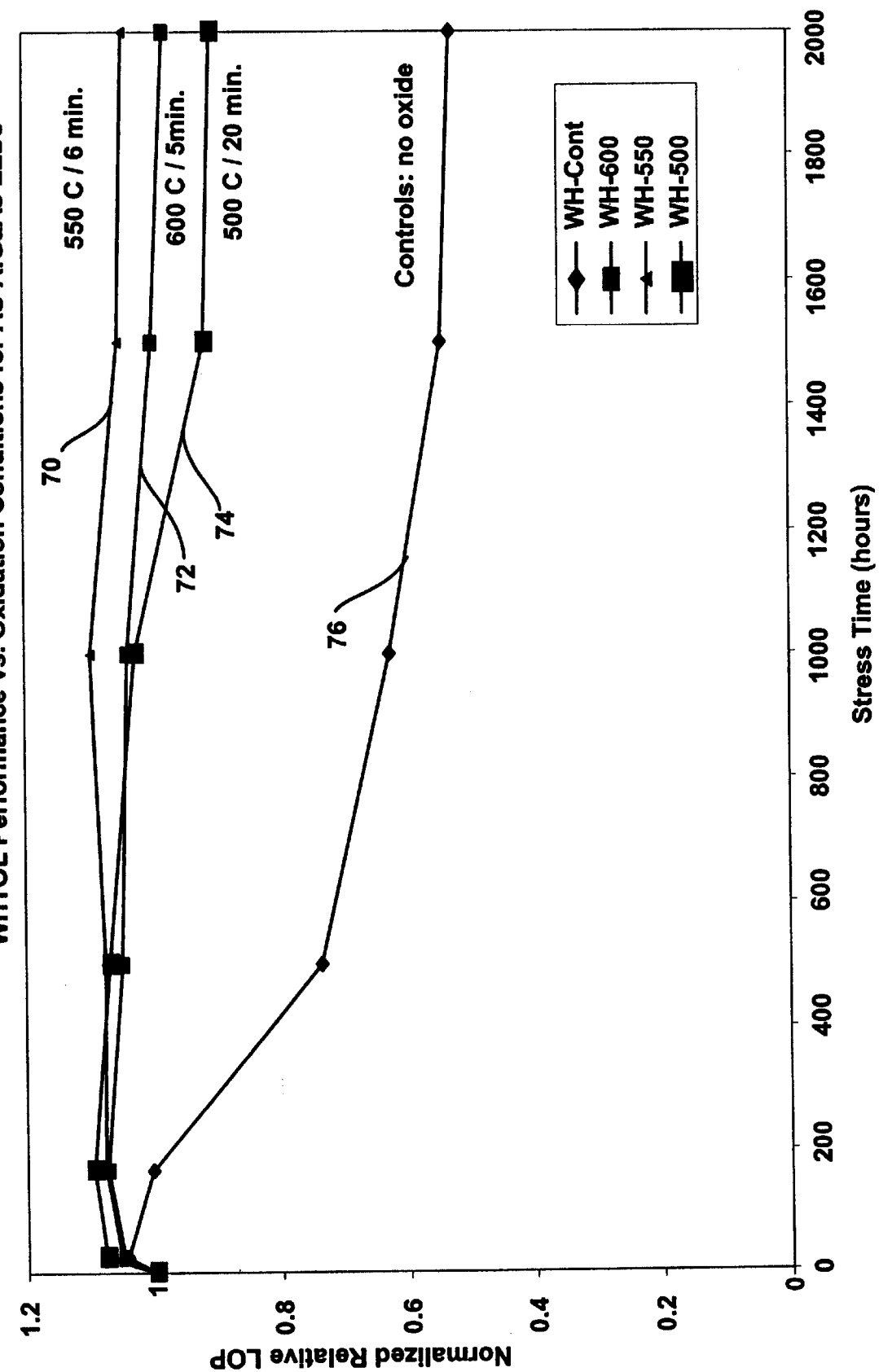
FIG. 9 WHTOL LOP degradation curves for Al-free substrate AlGaAs LEDs passivated at different time/temperature conditions.

Referring now to FIG. 9, therein is shown the WHTOL LOP degradation curves for Al-free substrate AlGaAs LEDs passivated at different time and temperature conditions (curves 70, 72, 74, and 76). In this case, optimal passivation seems to occur at approximately 550° C. for 6 minutes (as shown by curve 70). Device structures created under different growth conditions may need different temperatures to create a robust enough oxide for moisture resistance.

The ability to successfully passivate high-Al composition layers from WHTOL degradation offers the opportunity to incorporate new device designs that were previously unfeasible. For example, in light-emitting devices it is often desirable to incorporate wide band gap, high-Al composition layers for improved carrier confinement, carrier injection, wave guiding properties, etc. For example, it is known that the emission efficiencies of red-emitting AlGaAs LEDs can be improved by increasing the Al mole fraction of the high-composition confining layers immediately adjoining the active layer. However, destructive oxide degradation problems have limited the composition of these layers to x~0.6 to 0.75 in non-passivated devices. Using the passivation schemes described herein, it should be feasible to increase the composition of these confining layers to x~0.75 to 1.0, maximizing both LOP and WHTOL performance.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations which fall within the spirit and scope of the included claims. For instance, different material systems may include InAlGaAs, AlGaAsP, InAlGaAsP, InAlGaN, and combinations thereof. Given these combinations of materials with confining layers and an active layer in between, only two of the three layers have to have mole fractions of aluminum and only the layer containing the highest mole fraction of aluminum needs to be passivated. Also, this invention is applicable to other light-emitting devices; i.e. vertical cavity surface emitting lasers. All matters set forth herein or shown in the accompanying drawings are to be interpreted in an illustrative and non-limiting sense.

The invention claimed is:

1. A method of manufacturing Groups III–V light emitting semiconductors, the semiconductors having an active layer disposed between two layers with two of the layers having predetermined mole fractions of aluminum, processed on a semiconductor wafer to the point of passivation, comprising the steps of:

forming mesas on the semiconductor wafer to expose surfaces of the two layers having predetermined mole fractions of aluminum in the Groups III–V semiconductor layers therein;

passivating the exposed surface of the layer containing the highest predetermined mole fraction of aluminum of the two layers having predetermined mole fractions of to form a native oxide using a water vapor oxidation process; and singulating said mesas to form individual light emitting semiconductors.

2. The method as claimed in claim 1 wherein said step of:

passivating the exposed surface of the layer containing the highest predetermined mole fraction of aluminum of said two layers having predetermined mole fractions of aluminum to form a native oxide is performed from 500° C. to 650° C.

3. The method as claimed in claim 1 wherein said step of:

passivating the exposed surface of the layer containing the highest predetermined mole fraction of aluminum of said two layers having predetermined mole fractions of aluminum to form a native oxide is performed from 500° C. to 650° C. for one minute to sixty minutes.

4. The method as claimed in claim 1 including a step of:

forming the layers from a compound selected from a group consisting of AlGaAs, InAlGaAs, AlGaAsP, InAlGaAsP, InAlGaN, and combinations thereof.

5. The method as claimed in claim 1 wherein said step of:

forming said mesas on the semiconductor wafer exposes the surfaces of the two layers having predetermined mole fractions of aluminum in the Groups III–V semiconductor layers to a thickness of from two to six mils.

* * * * *